(12) United States Patent  
Scheja

(10) Patent No.: US 10,349,515 B2  
(45) Date of Patent: Jul. 9, 2019

(54) CAMERA SYSTEM

(71) Applicant: HEXAGON TECHNOLOGY CENTER GMBH, Heerbrugg (CH)

(72) Inventor: Jochen Scheja, Heerbrugg (CH)

(73) Assignee: HEXAGON TECHNOLOGY CENTER GMBH, Heerbrugg (CH)

( * ) Notice: Subject to any disclaimer, the term of this patent is extended or adjusted under 35 U.S.C. 154(b) by 13 days.

(21) Appl. No.: 15/669,921

(22) Filed: Aug. 5, 2017

(65) Prior Publication Data  
US 2018/0042106 A1 Feb. 8, 2018

(30) Foreign Application Priority Data

Aug. 5, 2016 (EP) ..................................... 16182914

(51) Int. Cl.  
*H04N 5/225* (2006.01)  
*H05K 1/02* (2006.01)

(52) U.S. Cl.  
CPC ......... *H05K 1/0271* (2013.01); *H04N 5/2253* (2013.01); *H04N 5/2254* (2013.01); *H05K 2201/068* (2013.01); *H05K 2201/10121* (2013.01); *H05K 2201/10151* (2013.01)

(58) Field of Classification Search  
CPC .. H04N 5/2253; H04N 5/2254; H05K 1/0271; H05K 2201/10151; H05K 2201/10121; H05K 2201/068  
See application file for complete search history.

(56) References Cited

U.S. PATENT DOCUMENTS

| | | | |
|---|---|---|---|
| 6,337,736 B1 | 1/2002 | Sugiyama et al. | |
| 6,717,819 B1* | 4/2004 | Chung | B32B 37/203 361/760 |
| 7,817,205 B2 | 10/2010 | Schulte et al. | |
| 2002/0109899 A1* | 8/2002 | Ohtaka | G02B 26/02 359/245 |

(Continued)

FOREIGN PATENT DOCUMENTS

| CN | 202004864 U | 10/2011 |
|---|---|---|
| DE | 10 2009 030 124 A1 | 12/2010 |

(Continued)

OTHER PUBLICATIONS

European Search Report dated Oct. 25, 2016 as received in Application No. 16182914.8.

*Primary Examiner* — Lin Ye  
*Assistant Examiner* — John H. Morehead, III  
(74) *Attorney, Agent, or Firm* — Maschoff Brennan

(57) ABSTRACT

A camera system including an objective, an objective holder carrying the objective, an image sensor and a printed circuit board. The printed circuit board and the image sensor are connected to one another in an electronically conductive manner, and the image sensor and the objective are arranged such that an image is n focus on the image sensor. The printed circuit board has a circuit layer made of an electrically insulating material and a printed circuit board substrate, wherein the printed circuit board substrate is manufactured from a material with a coefficient of thermal expansion aL which deviates by no more than 30% from the coefficient of thermal expansion of a material from which the objective holder is manufactured.

16 Claims, 8 Drawing Sheets

(56) References Cited

U.S. PATENT DOCUMENTS

| | | | |
|---|---|---|---|
| 2003/0056540 A1* | 3/2003 | Mukasa | A61B 1/00096 65/39 |
| 2006/0077368 A1* | 4/2006 | Iwata | G03F 7/70833 355/53 |
| 2010/0314703 A1* | 12/2010 | Chen | H01L 27/14618 257/432 |
| 2014/0192411 A1* | 7/2014 | Hirata | G02B 7/028 359/513 |
| 2015/0109422 A1 | 4/2015 | Weiss | |
| 2016/0266322 A1* | 9/2016 | Epitaux | G02B 6/4292 |
| 2017/0278764 A1* | 9/2017 | Partington | H01L 23/055 |
| 2018/0164476 A1* | 6/2018 | Berger | G02B 5/0268 |

FOREIGN PATENT DOCUMENTS

| | | |
|---|---|---|
| WO | 2005/060240 A1 | 6/2005 |
| WO | 2013/081339 A1 | 6/2013 |

* cited by examiner

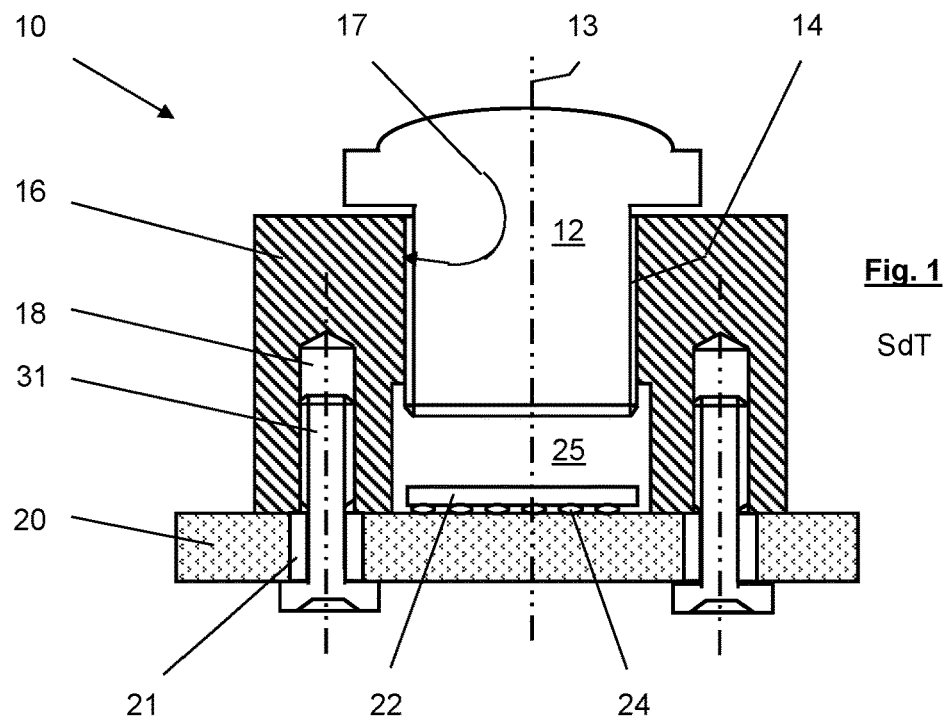
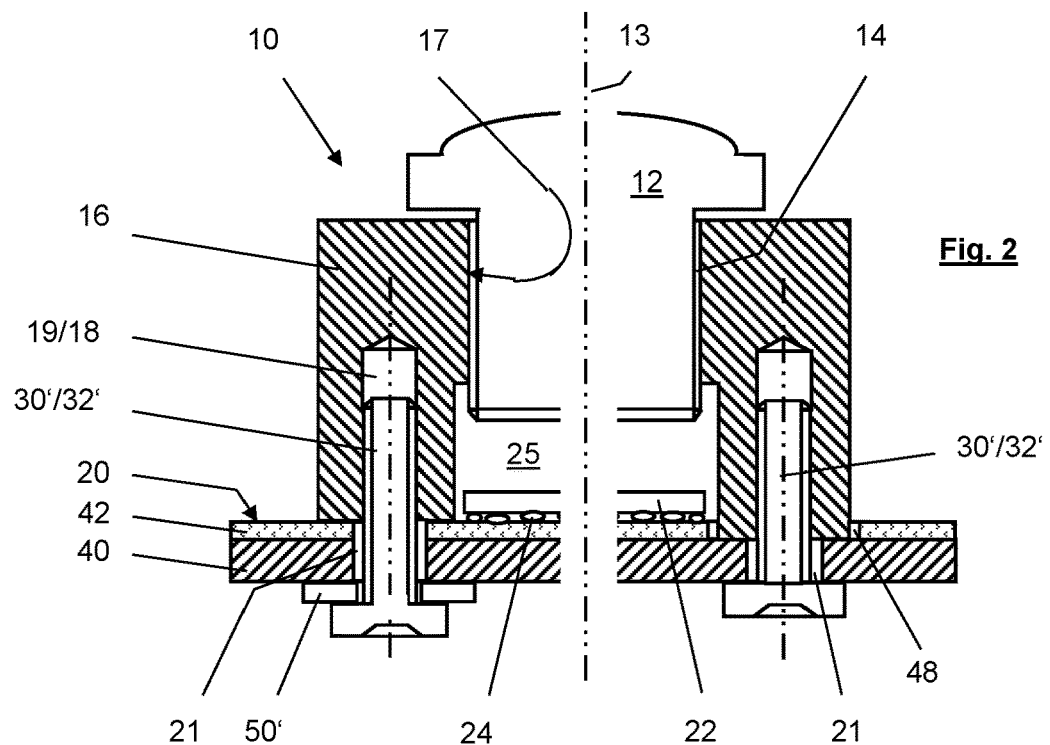

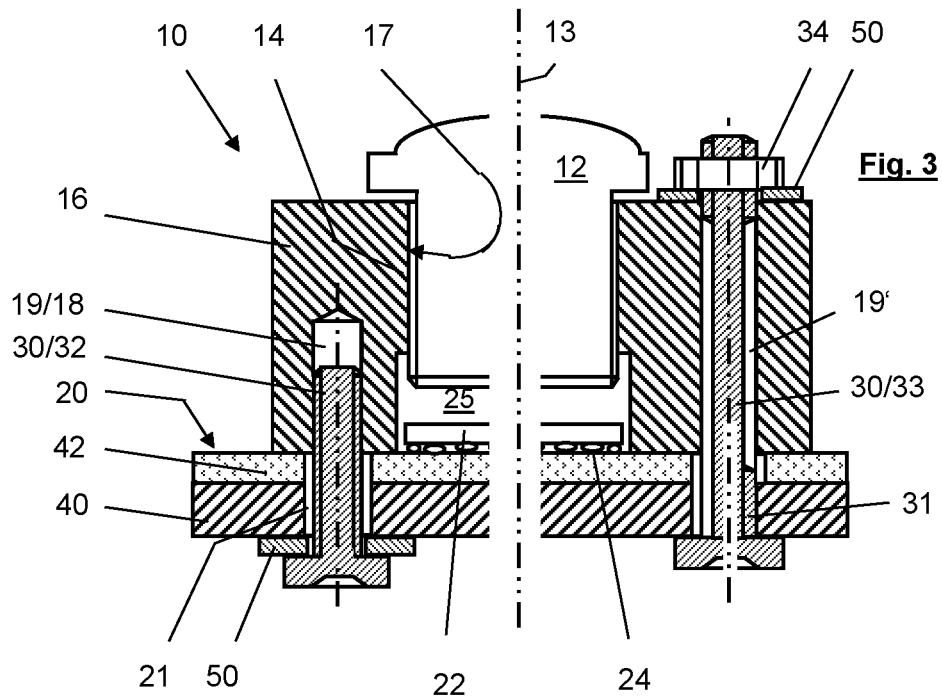
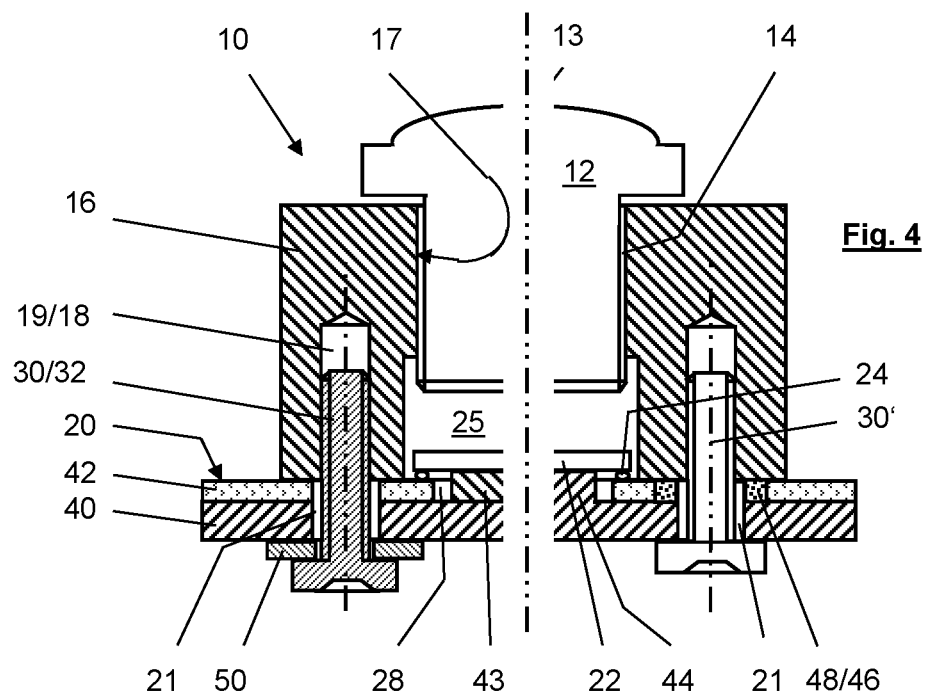

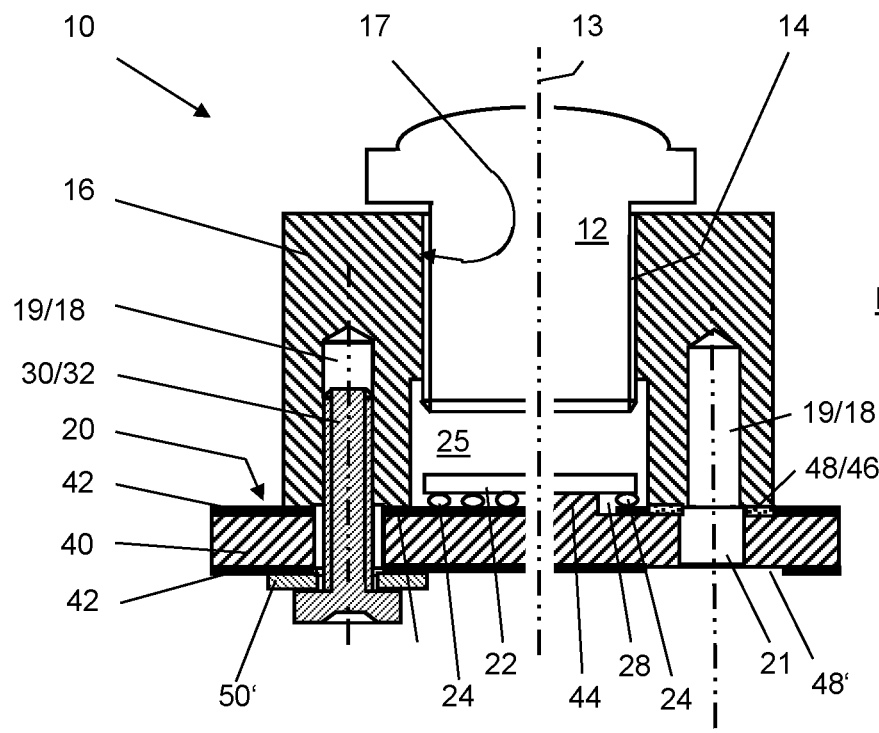
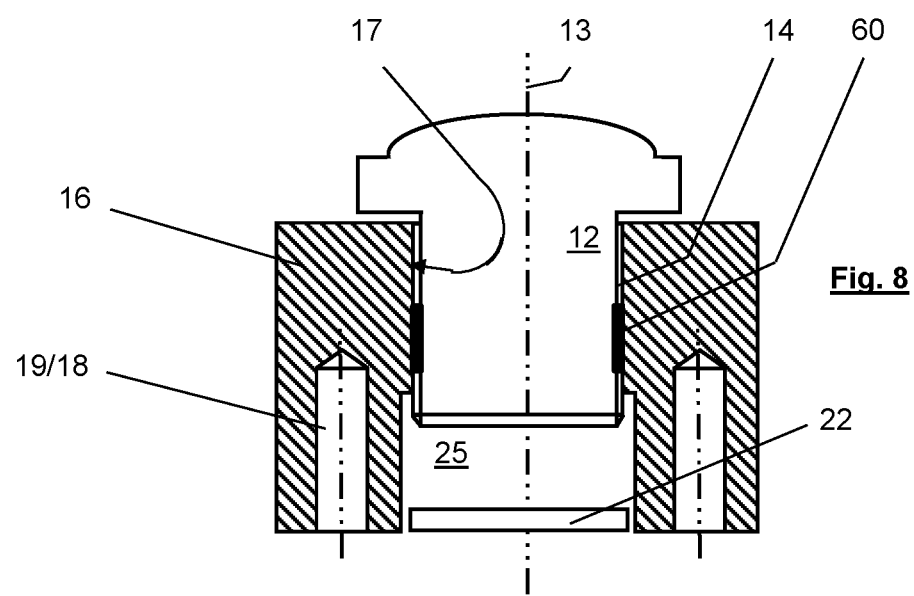

CAMERA SYSTEM

FIELD OF THE INVENTION

The present invention relates to a camera system for measurement applications.

BACKGROUND

Camera systems, as understood here, comprise: an objective; an objective holder with a reception opening into which the objective is inserted; an image sensor—also referred to as camera chip—, wherein image sensor and objective are arranged relative to one another, or may be arranged relative to one another, in such a way that an image is imageable on the image sensor in focus; further, a printed circuit board—also referred to as circuit board or PCB—, to which the image sensor is contacted in an electrically conductive manner such that the electrical signals which are produced by incident light in the image sensor are forwarded on to the printed circuit board. The electrical signals may then be processed by evaluation electronics which are situated on the printed circuit board or which constitute a unit electrically connected thereto or a unit which is connected by means of other signal transferring devices. Further, the term objective is used here within the meaning of this being understood as one or more objective lenses, or else a hollow body which, as a rule, is embodied as a tube in which objective lenses are arranged. Here, focusing may be carried out by repositioning the lenses or by twisting or displacing the tube, with the lenses situated therein, in the objective holder. The following may be used as a camera or camera chip: a CMOS, a CCD, a range imaging camera (depth measurement with time of flight), a photodiode array, focal plane arrays, a thermocam, multispectral sensors. Depending on requirements, spectral filters may also be provided in the optical path of the camera system, i.e., for example, attached in the tube or on the camera chip. The camera system may be designed to image wavelengths in the visible range, but also in the near and far infrared wavelength range.

FIG. 1 shows a typical example of a camera system 10 according to the prior art. In the example shown here, the objective 12 of the camera system 10 is provided with a male thread 14, with the aid of which the objective 12 is screwed into a female thread of a reception opening 17 of an objective holder 16. The reception opening 17 is continuous and forms a recess 25 in the extension of the optical axis 13 of the objective 12, the image sensor 22 being arranged in said recess in the assembled state. Here, the sensor plane of the image sensor 22 is arranged as orthogonal as possible to the optical axis 13 of the objective 12 and the center of the sensor plane is as flush as possible with the optical axis 13.

The image sensor 22 is fixed directly to a printed circuit board 20, with the fixation 24 e.g. being realized by a soldered connection or a welded connection such that the image sensor 22 is connected to the printed circuit board 20 in an electrically conductive manner and the electrical signals which are produced by incident light in the image sensor 22 can be transmitted to the printed circuit board for processing purposes. Soldered connections in the form of ball grid arrays were found to be particularly easy to produce and found to be a particularly stable, conductive, direct connection 24 between image sensor 22 and printed circuit board 20.

During the assembly, the printed circuit board 20 with the image sensor 22 affixed thereon is fastened to the objective holder 16 on that side of the objective holder 16 that lies opposite to the objective 12 in such a way that, firstly, the continuous opening 17 in the objective holder 16 is sealed by the printed circuit board 20, as a result of which the recess 25 emerges, and, secondly, the image sensor 22 is then placed into the recess 25, as described above, as perpendicularly and as centrally as possible in relation to the optical axis 13. To this end, the objective holder 16 has threaded bores 18 for receiving screws 31. The printed circuit board 20 has continuous attachment openings 21, which are arranged in such a way that they lie flush with the threaded bores 18 of the objective holder 16 when the image sensor 22 that is affixed to the printed circuit board 20 is aligned approximately perpendicular to the optical axis 13 with the sensor plane thereof and approximately flush with the optical axis 13 of the objective 16 with the center thereof. Then, the printed circuit board 20 is connected, in a detachable but secure manner, to the objective holder 16 in this position with the aid of the screws 31, which are passed through the attachment openings 21 of the printed circuit board 20 and twisted into the threaded bores 18. As may be identified from FIG. 1, the objective 12 and image sensor 22 are adjustable relative to one another in the lateral position—at least in respect of a plane that is aligned approximately perpendicular to the optical axis 13 of the objective—if the screws 31 have not been tightened completely and said objective and image sensor may then be affixed in this adjusted position by tightening the screws. Alternatively, a defined lateral position prescription may be realized in place of the lateral adjustability, for example by way of mechanical positioning means, such as e.g. positioning pins arranged on the objective holder, said mechanical positioning means engaging into positioning recesses of the printed circuit board that are embodied in a mirror inverted manner, or vice versa. Additional attachment may also be ensured e.g. by adhesive or lacquer points.

In the example shown here, the distance between the objective 12 and image sensor 22 may be adjusted for focusing purposes, for example by virtue of the objective, with the objective thread 14 thereof, being screwed deeper into the reception opening 17 of the objective holder 16 or being rotated further out of said reception opening. In this way, the image sensor 22 and the objective 12 may be arranged relative to one another along the optical axis in such a way that an image projected onto the image sensor 22 via the objective 12 is imaged in focus on the image sensor 22.

Camera systems of the type described above are often constituents of relatively high-quality photo cameras and then, as a rule, also have a variable focus. In a simple embodiment of such a camera system, a focusing device ensures focus. Here, the objective thread is actuated in a motor-driven manner, rendering it possible to variably set the distance between the image sensor and the objective correspondingly as described above by twisting the objective in the objective holder, such that a sharp image can be produced on the image sensor over a broad range. The demands on camera systems, which are used in such photo cameras, in respect of the ability to calibrate or in respect of accuracies or tolerable aberrations which, for example, may also emerge from tremors or temperature variations, may, as a rule, be satisfied well using the currently available structures and technical components. However, if this relates to highest precision of image capture, such focusing devices often act as sources of errors on account of their many parts that are movable in relation to one another.

Thus, the predetermined demands are often not satisfied by the above-mentioned camera systems when they are constituents of precise measuring appliances. Aberrations which, especially quantitatively, are often predictable with difficulties, or not at all, are often observed with such camera systems, even in measuring appliances in which a focusing device—and hence one of the sources of errors (see above)—can be dispensed with in the camera system (e.g. because the distance variation which needs to be capturable by the camera system is small). In addition to suddenly occurring aberrations, e.g. after tremors, shocks or sudden temperature variations, these also include, inter alia, measurement value drift and/or hysteresis effects. Due to the lack of predictability, a compensation of such aberrations by means of software, or else an appropriate calibration, is often only possible with great difficulties, or not at all, or a calibration must be carried out very frequently.

Even if—as described above—a focusing device is not provided, the connection between objective and objective holder nevertheless remains as a source of error in many cases since, as explained above, the connection between the objective and the image sensor on the printed circuit board is generally embodied in the form of a screw connection that is realized by the objective holder.

A further source of error in precision applications can lie in different coefficients of thermal expansion within the objective, i.e. the objective lenses on the one hand and the tube carrying the lenses on the other hand, but also between the objective and objective holder. As a rule, the objective lenses are manufactured from glass and therefore have a comparatively small coefficient of thermal expansion $a_{G1}$ in the region of $a_{G1}=0.5*10^{-6}K^{-1}$ to $9*10^{-6}K^{-1}$. By contrast, the tube or objective holder are often manufactured from aluminum or an aluminum alloy, and so the coefficient of thermal expansion $a_{Ob}$ thereof lies in the region of $a_{Ob}=22*10^{-6}K^{-1}$ to $24*10^{-6}K^{-1}$.

The connection or attachment of the image sensor on the printed circuit board may also constitute a further source of error in respect of precise measurements using the camera system. As already mentioned above, very different options are known for this attachment, such as soldering and welding and an embodiment of the image sensor as an SMD chip with connection pins for THT connection technology. The option for direct connection between image sensor and printed circuit board which, of the known connections, is probably the most mechanically rigid is the connection by means of a ball grid array (BGA). In the ball grid array, solder beads arranged in a grid are melted by reflow soldering, i.e. by heating in a soldering furnace, such that, subsequently, the molten and re-solidified soldering material securely connects contact pads of the image sensor with contact pads of the printed circuit board.

A further source of error arising when such camera systems are used in measuring appliances for highly precise measurements is also formed by the conventionally used printed circuit boards, which, as a rule, are manufactured from FR4 with copper conductor tracks. FR4 is a composite material made of a low-flammable and flame-retardant epoxy resin and glass fiber tissue, which has anisotropic, i.e. direction-dependent, coefficients of thermal expansion of typically $a_x=14*10^{-6}K^{-1}$; $a_y=18*10^{-6}K^{-1}$; $a_z=60*10^{-6}K^{-1}$ (the indices x, y, z represent the Cartesian directions). Slots for pin-established camera chips or for positioning aids for SMD camera chips that can be soldered on directly and also the continuous attachment openings, by means of which the printed circuit board—usually with the aid of screws—is connected to the objective holder and the objective situated therein, cannot be manufactured in the printed circuit board with an accuracy that is sufficient for the demands of such measuring appliances. That is why the position of the camera chip on the printed circuit board, the position of the printed circuit board in relation to the objective holder and hence also the position of the camera chip in relation to the objective cannot be set with sufficient accuracy or the positions thereof change in relation to one another, e.g. in the case of tremors or temperature variations, etc.

CN202004864U therefore proposes a positioning aid in the form of an aluminum template, which remains in the camera system, even after the positioning. The aluminum template has a precisely defined slot for the camera chip and it is welded onto the printed circuit board together with the camera chip. The aluminum template is only slightly larger than the camera chip and has passage openings to the side of the camera chip, said passage openings being flush with the attachment openings of the printed circuit board in the welded-on state. Since, according to assertions made in this document, the aluminum template with the slot thereof for the camera chip and with the passage openings thereof can be worked on much more precisely than the printed circuit board, substantially more accurate positioning of the individual components in relation to one another may be achieved during the assembly with the aid of the aluminum template.

In other known camera systems, the errors which arise, in particular, from manufacturing tolerances of the attachment openings of the printed circuit board are to be avoided by a glass-based connection structure. Here, a rear side of the image sensor is connected to a printed circuit board in a conventional manner; by contrast, the front face of the image sensor is adhesively bonded to a carrier glass. The carrier glass projects beyond the edge of the image sensor. This projecting edge of the carrier glass is securely connected to the objective holder, into which the objective is screwed, with the side thereof facing away from the image sensor, for example by means of a temperature-stable adhesive bond. In this way, the printed circuit board is only connected to the objective holder via the image sensor. All sources of error which may be due to connecting the image sensor via a printed circuit board and screws to the objective holder have been removed by this structure. By contrast, it appears to be comparatively easily possible to introduce positioning aids for the attachment of the image sensor on the one hand and for the attachment of the glass plate on the objective holder on the other hand into the glass plate with a high precision. However, this structure is very complicated in terms of the production thereof and the printed circuit board is only connected to the camera system by means of the conventional joints to the image sensor such that, in the case of tremors or shocks, the stability of the image sensor-printed circuit board connection must be ensured by the joints only.

SUMMARY

An object of some embodiments of the present invention is that of providing a camera system which is simple and cost-effective in terms of the production thereof and nevertheless reduces or avoids at least some of the aforementioned serious disadvantages, in particular for use in precision measuring appliances, such as measurement value drift, hysteresis effects and difficult to predict errors.

These objects are achieved at least in part by a camera system in accordance with claim 1 or by developments as reproduced in the dependent claims.

Such a camera system comprises an objective with a tube and with at least one objective lens arranged in the tube, an objective holder that carries the objective, an image sensor, and a printed circuit board. The printed circuit board and the image sensor are connected to one another in an electrically conductive manner such that the electronic signals which can be transmitted by the light, which impinges on the image sensor through the objective, for processing purposes to the circuits of the printed circuit board. The image sensor and the objective are arrangeable in relation to one another in such a way that an image that is projected onto the image sensor by way of the objective is imageable on the image sensor in focus. Here, the objective holder and the printed circuit board are manufactured from materials, the coefficients of thermal expansion of which deviate from one another by less than 30%.

In a first embodiment, the printed circuit board is manufactured as an FR4 board which has a coefficient of thermal expansion in the xy-plane in the region of $a_L=12*10^{-6}$/K to $14*10^{-6}$/K and the objective holder is produced from a stainless steel, the coefficient of thermal expansion of which likewise lies in the region of $a_O=10*10^{-6}$/K to $16*10^{-6}$/K, such as e.g. chrome steel 1.4034 (X46Cr13) with $a_O=10.5*10^{-6}$/K at 20° C.-100° C.

In another embodiment, the printed circuit board comprises a printed circuit board substrate, on which at least one circuit layer is arranged. The circuit layer substantially comprises a layer made of electrically insulating material, such as PA or FR4, and the predetermined circuits of the printed circuit board, which are preferably manufactured from copper. The printed circuit board substrate is manufactured from a material, the coefficient of thermal expansion $a_L$ of which deviates by no more than 30%, better by no more than 25%, even better by no more than 20%, from the coefficient of thermal expansion $a_O$ of the material from which the objective holder is manufactured. Here, it is understood that the coefficients of thermal expansion $a_L$, $a_O$ relate to a temperature range of approximately −5° C. to +90° C. Here, materials for the printed circuit board substrate which moreover have a good conductivity, such as e.g. copper or aluminum and the alloys thereof, are particularly preferred.

If the coefficients of thermal expansion of the printed circuit board substrate $a_L$ and of the objective holder $a_O$ differ by no more than 30%, better by no more than 20% to 25%, from one another, it is possible to avoid thermal tension between the printed circuit board and objective holder, said tension possibly leading to errors, in particular to measurement value drift. If, as is known from the prior art, the objective holder and printed circuit board are connected to one another by means of a screw-in connection, this can also counteract a loosening of the screw-in connection.

Naturally, it is better if the difference Δa between the coefficients of thermal expansion $a_L$ (printed circuit board) and $a_O$ (objective holder) is less than 10% or even is as small as possible. It is particularly advantageous if the coefficients of thermal expansion $a_L$ (printed circuit board) and $a_O$ (objective holder) are equal (Δa=0); of course, the easiest way of achieving this is by using the same material for a printed circuit board substrate and the objective holder. Expressed differently: the difference Δa between the coefficient of thermal expansion $a_L$ of the printed circuit board substrate and $a_O$ of the objective holder should lie in the region of 0≤Δa≤30%.

It is particularly advantageous, in particular for highly stable camera systems, if tube, objective holder and printed circuit board substrate are each manufactured from a material, the coefficient of thermal expansion of which deviates by no more than 30%, better by no more than 25%, from the coefficient of thermal expansion of the at least one objective lens. By way of example, if the at least one objective lens is made of BK7 with a coefficient of thermal expansion of approximately $a=7*10^{-6}$/K, then tube, objective holder and printed circuit board substrate may, for example, be manufactured from titanium because titanium has a coefficient of thermal expansion of approximately $a=8*10^{-6}$/K to $9*10^{-6}$/K.

In another embodiment, the focus is placed on thermal adaptation of the camera chip (=image sensor) and printed circuit board substrate. In this example, the printed circuit board substrate is manufactured from a material, the coefficient of thermal expansion of which deviates by at most 25% to 30% from the coefficient of thermal expansion of the image sensor/camera chip. As a rule, the camera chip is manufactured from silicon, which has a coefficient of thermal expansion of $a_B=2*10^{-6}$/K to $3*10^{-6}$/K. The selection of a suitable material for the printed circuit board substrate, such as e.g. invar with a coefficient of thermal expansion of $a_L=1*10^{-6}$/K to $2*10^{-6}$/K, also satisfies the highest demands on thermal stability. In this case, ceramics and glass ceramics are other possible materials for the printed circuit board substrate. Therein, the expansion coefficient may, as a rule, be set individually by the selection of the mixture components.

The aforementioned components of the camera system, namely objective holder; objective lens(es) and tube (also referred to together as objective); printed circuit board substrate and circuit layer(s) (also referred to together as printed circuit board), may, in the assembled state, either be connected to one another by means of the connection types described in more detail below or they may be connected to one another only by way of a thermally stable adhesive connection, or else they may also be adhesively bonded to one another in addition to the connection types described in more detail below. To this end, either the employed adhesive has a coefficient of thermal expansion which deviates by no more than 25% to 30% from that expansion coefficient of the materials from which the components to be connected are manufactured, and/or the adhesive is selected in such a way that it can absorb the thermal tensions which arise on account of different coefficients of thermal expansion of the components to be connected, and so the components do not move, or only move minimally, in relation to one another despite the different expansions. By way of example, such an adhesive has a coefficient of thermal expansion in the region of $a_K=22*10^{-6}$/K to $25*10^{-6}$/K and preferably has a hardness in the region of 75 to 95 Shore D.

Advantageously, the material from which the objective holder or the printed circuit board substrate is produced is a material selected from the following group of materials: Cu alloys, such as bronze or brass; stainless steel, in particular low-alloyed stainless steel; magnesium alloy; aluminum, aluminum alloys, in particular wrought aluminum alloys such as e.g. EN AW-6061; alternatively, use may also be made of printed circuit board substrates requiring more complicated production, made of glass, glass ceramic or ceramic; here, the materials are selected in such a way that the following applies to the deviation $\Delta a_L$ of the coefficient of thermal expansion $a_L$ of the material of the printed circuit board substrate from the coefficient of thermal expansion $a_O$ of the material of the objective holder: 0%≤$\Delta a_L$≤30%, better 0%≤$\Delta a_L$≤20% or even better 0%≤$\Delta a_L$≤10%.

If the printed circuit board substrate is manufactured from a metal, an additional effect is that heat is dissipated well, which likewise counteracts thermal tensions and hence thermally induced errors.

If the material which is selected for the printed circuit board substrate or objective holder can moreover be processed well, it is also possible to keep the manufacturing tolerances low, e.g. fit bores with a tolerance field of less than 10 micrometers, which likewise prevents measurement errors and also counteracts loosening of screw-in connections. Here, being processed well means, in particular, that the material may be processed well by cutting or machining, i.e., for example, it forms flow chips or a good surface quality is obtainable during the machining processing (such as turning, milling, boring, polishing) or the material exhibits a high edge-holding property (edge-holding property, see e.g. DIN 6583).

If the objective holder and the printed circuit board are connected to one another by means of connecting elements (screws, clamps, bolts), it is likewise advantageous if the connecting elements are produced from a material, the coefficient of thermal expansion $a_V$ of which in relation to the expansion coefficient of the objective holder lies in the region of $0\% \leq \Delta a \leq 30\%$, better $0\% \leq \Delta a \leq 20\%$ or even better $0\% \leq \Delta a \leq 10\%$.

If the connecting elements are clamps, rivets, screws, studs, nuts, etc., and if these are embodied as described in the preceding paragraph, it is also advantageous if washers and/or screw securing elements, such as spring washers, Schnorr washers, etc., are manufactured from a material, the coefficient of thermal expansion of which in relation to the expansion coefficient of the objective holder lies in the region of $0\% \leq \Delta a \leq 30\%$.

As is known from the prior art, the image sensor may be welded or soldered onto the printed circuit board or its circuit layer or soldered thereon by means of the ball grid array. However, in addition to realizations as a soldered connection or a welded connection, any other type of conductive connection is likewise conceivable, such as e.g. an electrically conductive adhesive, conductive rubber, spring contacts, flexible printed circuit boards, bond wires or plug-in connections (THT) etc., or combinations thereof.

In a particularly advantageous variant of the camera system, the image sensor is connected, along the edges thereof, to the circuit layer of the printed circuit board by means of an electrically conductive connection, with the circuit layer having a hole in a region under the image sensor and this hole being surrounded by the conducting connection(s) situated close to the edge. The image sensor is securely connected to the printed circuit board substrate through this hole by means of a support element. This allows more stable positioning of the image sensor to be achieved in relation to the printed circuit board and, by way of the printed circuit board, with the objective holder and, therewith, in relation to the objective, to be precise more stable than if the image sensor were only connected to the circuit layer of the printed circuit board by means of a soldered connection or the like.

If the support element is manufactured from a material whose coefficient of thermal expansion in relation to the expansion coefficient of the printed circuit board substrate lies in the region of $0\% \leq \Delta a \leq 30\%$, better $0\% \leq \Delta a \leq 20\%$ to 25%, thermal effects are moreover minimized. Thermal effects can be minimized even further if the support element is manufactured from the same material as the printed circuit board substrate and, in particular, if it has an integral embodiment with the printed circuit board substrate.

If, moreover, the printed circuit board substrate and the support element are made of a material which has virtually the same, or in fact the same, coefficient of thermal expansion as the objective holder, but, in any case, has a difference $\Delta a$ in the region of $0\% \leq \Delta a \leq 30\%$, it is possible to eliminate thermally induced measurement errors virtually completely.

If the image sensor is connected to the printed circuit board substrate by means of the support element, as is described above, the connection between image sensor and support element is advantageously realized by soldering, welding, cementing or thermally stable adhesive bonding.

It is particularly advantageous to mount the image sensor in a floating manner on the printed circuit board substrate because this has a compensational effect in relation to thermal and mechanical tensions. In the case of the connection between two components which is referred to here as a "floating mount", in particular between image sensor and printed circuit board substrate, the image sensor is securely connected to the printed circuit board substrate by means of at most three hard adhesive spots, better only by means of one hard adhesive spot. Optionally, it may moreover be connected to the printed circuit board substrate by means of further, soft adhesive spots. The number of hard adhesive spots and whether, and how many, soft adhesive spots are used in the case of such a floating mount depends on the size of the image sensor and the materials from which the image sensor and the printed circuit board substrate are manufactured. Here, hard adhesive spots are understood to mean adhesive spots at which the adhesive point has a higher shear rigidity, at least in comparison with the soft adhesive spots, in the cured state.

The properties of the connection between two components referred to here as a "floating mount" are determined by the selection of the adhesive or the adhesives, but also by the geometry of the adhesive bond, e.g. by the adhesive gap thickness, the number and distribution of the adhesive points and the ratio of adhesively bonded and non-bonded areas.

Depending on which objects the printed circuit board is intended to fulfill, it may be expedient to provide either a printed circuit board which has a circuit layer on only one side of the printed circuit board substrate or a printed circuit board which has a circuit layer both on the side of the printed circuit board substrate that faces the image sensor and on the side that faces away from the image sensor. Multi-layer printed circuit boards with one or more printed circuit board substrates and, accordingly, either with a plurality of circuit layers arranged directly over one another or with circuit layers at least partly separated from one another by printed circuit board substrate are also conceivable.

Printed circuit boards with a symmetric design are advantageous, i.e. with a printed circuit board substrate e.g. made of aluminum or an aluminum alloy or another metal, or else made of ceramic, glass, glass ceramic, and an equal number of circuit layers arranged over one another on each one of the two sides of the printed circuit board substrate, wherein the circuit layers comprise circuits that are preferably manufactured from copper with a thickness of 0.035 mm to 0.02 mm and with a dielectric with a relatively low thickness of e.g. 0.05 mm to 0.8 mm, in particular 0.3 mm. The dielectric preferably has only little, or no, fiber reinforcement and is e.g. a PA or FR4. By way of example 5 to 8 or even more of such circuit layers may be provided over one another on each side of the printed circuit board substrate. The circuit layers are pressed and adhesively bonded over their entire area. As a result of the composite with shear rigidity resulting therefrom and as a result of the lower rigidity of the circuit layers in relation to the printed circuit board substrate, the circuit layers substantially follow the expansion of the printed circuit board substrate.

In a further advantageous embodiment, the objective holder is provided with positioning flanges in the region of the attachment recesses for receiving connecting elements, said positioning flanges projecting in the direction of the printed circuit board to be assembled and preferably lengthening the attachment recesses in a flush manner. The attachment openings in the printed circuit board are configured in such a way that they receive the positioning flanges of the objective holder, advantageously with little or no play like, for example, with a H7/g6 clearance fit or by means of a press fit. Here, it is also possible for different geometries to be provided in partial press fits, such as e.g. a square positioning flange in a circular attachment opening with a diameter or edge length appropriately matched to one another, and the like. Alternatively, or additionally, the positioning flanges of the objective holder may be adhesively bonded into the attachment openings of the printed circuit board. In this way, the connection between printed circuit board and, in particular, the printed circuit board substrate and the objective holder is improved further.

In a further embodiment, the objective holder and the printed circuit board substrate each have a thread, by means of which they can be screwed into one another. As a result of the possibility of screwing these two elements into one another directly rather than by way of screws and nuts, it is possible to remove further sources of errors.

In a further embodiment, the objective holder and the printed circuit board substrate are welded, soldered or adhesively bonded to one another. Although it is no longer possible to separate the elements from one another in a non-destructive manner, the stability of this connection, in particular the thermal stability thereof as well, is excellent.

Even better results are obtained if the objective holder and printed circuit board substrate are embodied in integral fashion.

Adhesively bonding the objective into the reception opening of the objective holder likewise has an error-reducing effect.

By way of example, form-stable, two-component epoxy adhesives with a good thermal conductivity in the region of 1.2 W/mK to 1.6 W/mK and a coefficient of thermal expansion in the region of $20*10^{-6}$ $K^{-1}$ to $27*10^{-6}$ $K^{-1}$ are suitable for the various adhesive bonds proposed above. Depending on the desired location of use, it is advantageous to use such a two-component adhesive which is rather softer or harder in the cured state. For an adhesive connection between the objective holder and the printed circuit board or between the tube of the objective and the objective holder, use can be made of those adhesives with hardnesses in the region of 75 to 95 Shore D, even better in the region of 80 to 85 Shore D.

BRIEF DESCRIPTION OF THE DRAWINGS

A camera system according to the invention is described in more detail below on the basis of exemplary embodiments that are depicted in the figures. The figures are not true to scale and individual elements may be depicted in an exaggerated fashion for elucidation purposes. In the various figures, the same components are denoted by the same reference signs. The explanations are only by way of example and have no limiting effect. Purely schematically, in the figures:

FIG. 1 shows a section of a camera system according to the prior art;

FIG. 2 shows a section of a first embodiment of a camera system according to the invention;

FIG. 3 shows, likewise in a section, a variant of the embodiment of the camera system that is depicted in FIG. 2;

FIG. 4 shows a further variant of the embodiment of the camera system that is depicted in FIG. 2;

FIG. 7 likewise shows, in a section, a further embodiment of a camera system;

FIG. 8 shows a further measure according to the invention on the basis of a section of a camera system as depicted in FIGS. 2 to 7;

DETAILED DESCRIPTION

Figure 5A:
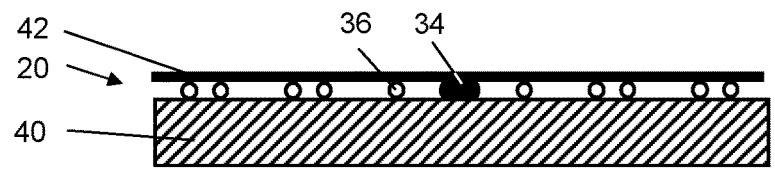
FIGS. 5a, 5b show, in sections, examples of a printed circuit board substrate with a circuit layer mounted in a floating manner thereon or an image sensor mounted in a floating manner.

FIG. 2 depicts a first embodiment of a camera system 10 according to the invention. It comprises an objective 12 which is provided with a male thread 14. The objective 12 comprises a tube and, arranged therein, at least one lens, also referred to as objective lens(es). The lens(es) are manufactured from glass or any other optically transparent medium which is matched to the requirements of a measuring appliance, in which the camera system is intended to be used. Further, the camera system 10 comprises an objective holder 16 with a reception opening 17 for receiving the objective 12 which has a continuous configuration in this example. The reception opening 17 is provided with a female thread, with the female thread not having to be continuous but possibly being continuous. The female thread and the diameter of the reception opening 17 in the region of the female thread are matched to the external diameter of the objective 12 in the region of its male thread 14 such that the objective 12 can be screwed into the objective holder 16 with the aid of the objective thread 14. Here, use is often made of a fine-pitch thread, specifically with little thread play or preferably none at all. When the objective 12 is screwed in, the continuous reception opening 17, together with a part of the objective 12, forms a recess 25 in the objective holder 16 in the direction of the optical axis 13 of the screwed-in objective 12, said recess being accessible from the side lying opposite to the objective 12 and serving to receive the image sensor 22. The image sensor 22 is connected to a printed circuit board 20 by means of an electrically conductive connection 24, in particular by means of a stable soldered connection such as e.g. by means of a ball grid array.

During the assembly, the printed circuit board 20 with the image sensor 22 affixed thereon is fastened to the objective holder 16 on that side of the objective holder 16 that lies opposite to the objective 12 such that, to the extent that this is technically possible, the image sensor 22 fastened to the printed circuit board 20 is preferably placed flush with its center and preferably placed perpendicular to the optical axis 13 aligned in the recess 25 with its sensor plane. To this end, the objective holder has fastening recesses 19 in this example, said fastening recesses 19 being embodied as threaded bores 18 in the example shown. The printed circuit board 20 is provided with continuous attachment openings 21 which are arranged in such a way that they are flush with the attachment recesses 19 of the objective holder 16 when, with the center of the image sensor 22, said image sensor 22 affixed to the printed circuit board 20 is aligned flush with the optical axis 13 of the objective. The printed circuit board 20 and, with it, the image sensor 22 are detachably securely connected to the objective holder 16 in the described position with the aid of connecting elements 30'. In the embodiment shown here, the connecting elements 30' are embodied as screws 32' that interact with the threaded bores 18 and are made of any fitting material. The attachment by means of the screws 32' can be brought about with a washer/screw securing element 50'—such as a split washer, snap rings, Schnorr washer, etc.—as depicted on the left-hand side of FIG. 2 or, slightly less expediently, without a washer and/or without screw securing elements (split washer, Schnorr washer, etc.), as depicted on the right-hand side of FIG. 2. The washer/screw securing element 50' is also made of any fitting material in this example.

The printed circuit board 20 advantageously comprises a printed circuit board substrate 40 and, on its side facing the image sensor 22, a circuit layer 42, to which the image sensor 22 is connected in an electrically conductive manner. As depicted on the left-hand side of FIG. 2, the circuit layer 42 may be clamped between the printed circuit board substrate 40 and objective holder 16 during assembly or the circuit layer 42 may have a recess 48 in this region such that the objective holder 16 and printed circuit board substrate 40 contact one another here, as depicted on the right-hand side of FIG. 2.

As may be identified from FIG. 2, the printed circuit board 20 with the image sensor 22 affixed thereon is connected to the objective holder 16 in this example in such a way that the continuous opening 17 or the recess 25 is closed off by the printed circuit board 20. Advantageously, the recess 25 is thus dirt- and dust-proof and, even better, also sealed tightly in respect of moisture. To this end, provision may also be made of an appropriate seal, for example with sealing rubber, a silicone seal, a labyrinth seal, etc. However, it is also conceivable that the recess is not sealed by the printed circuit board after the assembly or even, with a little spacing from the objective holder, affixed at the latter which, in the case of corresponding requirements, is e.g. advantageous in respect of the accessibility of the components. Also, the circuit layer is not squashed in this case or a corresponding recess in the circuit layer can be dispensed with.

Advantageously, as shown in FIG. 2, the printed circuit board 20 has a circuit layer 42 made of electrically insulating material, which has the predetermined circuits of the printed circuit board and possibly further electrical components, and a printed circuit board substrate 40 that is manufactured from a material whose coefficient of thermal expansion $a_L$ deviates by no more than 25% to 30% from the coefficient of thermal expansion $a_O$ of the objective holder 16. As a result, thermal tensions between the printed circuit board 20 and the objective holder 16 are avoided, said tensions possibly leading to errors, in particular to measurement value drift. It is better if the difference between the coefficients of thermal expansion $a_L$ (printed circuit board) and $a_O$ (objective holder) is less than 20%, even better less than 10% or even as small as possible. It is particularly advantageous if the printed circuit board substrate 40 is made of the same material as the objective holder 16. Loosening of the screw-in connection is also counteracted by this material selection.

The aforementioned measurement errors can also be counteracted by virtue of selecting the connecting elements 30 to be made of a material, whose coefficient of thermal expansion $a_V$ is also as similar as possible to that of the objective holder $a_O$, as shown e.g. in FIG. 3. Here too, differences in the expansion coefficients of at most 25% to 30%, better at most 10%, are expedient. On its own, this is already an expedient measure to counteract a loosening of the screw-in connection and hence to counteract measurement errors. Instead of realizing the connecting elements 30 in the form of screws 32 (depicted in FIG. 3 on the left-hand side), it is also conceivable to realize these in the form of threaded bolts 33 and nuts 34 (depicted in FIG. 3 on the right-hand side) or through bolts and nuts, rivets etc. The attachment recesses 19 then are correspondingly configured as continuous recesses 19' (right-hand side) which, depending on requirements, are provided with or without a thread or only in part with a thread. If work is carried out with threaded bolts 33 and nuts 34 or through bolts and nuts, it is also possible to provide the printed circuit board substrate 40 with a thread 31 (see right-hand side, bottom right in FIG. 3). Once again, it is possible to realize the connection with or without washers/screw securing elements 50. Here, an appropriate material selection with an adapted coefficient of thermal expansion is also positive in respect of the washers/screw securing elements 50.

A development of the camera system 10, as described on the basis of FIGS. 2 and 3, is depicted in FIG. 4. In order not only to counteract the measurement errors whose origin lies in the connection between the printed circuit board 20 and the objective holder 16 (cf. embodiment of FIGS. 2 and 3), the image sensor 20 in the variant shown in FIG. 4 is, once again, embodied as an SMD chip which, in this case, however is only connected to the circuit layer 42 of the printed circuit board 20 along the edges of said chip in an electrically conductive fashion. The circuit layer 42 has a hole 28 under the image sensor 22. The image sensor is securely connected to the printed circuit board substrate 40 through this hole 28 by means of a support element 43, 44, with the support element 43, 44 preferably being manufactured from the same material as the printed circuit board substrate 40 or else, at least, from a material with a coefficient of thermal expansion very similar thereto. The support element 43, 44 is either embodied as a separate component 43 (depicted on the left-hand side in FIG. 4), which is preferably securely connected to the printed circuit board substrate 40 by soldering, welding or adhesive bonding or, even better, it has an integral embodiment with the printed circuit board substrate 40 (support element 44, depicted on the right-hand side in FIG. 4). The image sensor 22 is preferably likewise connected to the support element 43, 44 by either soldering, welding or adhesive bonding. As a result of this direct connection of the image sensor 22 to a material with a very similar, if not even identical, coefficient of thermal expansion to that of the objective holder 16, it is possible to further reduce thermally induced measurement errors.

As indicated in FIGS. 3 and 4, it is naturally also possible in this case again to realize the connection between printed circuit board 20 and objective holder 16 by way of a screw-in, rivet or bolt connection, in which the screws 32' or bolts and nuts are manufactured from any fitting material (right-hand side in FIG. 4) or in which the screws 32 or bolts and nuts made of a material which has a similar expansion coefficient to the material of the objective holder 16 or of the printed circuit board substrate 40 (left-hand side in FIG. 4). Both variants can once again be realized with or without washers/screw securing elements 50.

As already described further above, FIG. 4 also illustrates on the right-hand side that the circuit layer 42 has a recess 48 in the region of the connection between the printed circuit board 20 and objective holder 16. In this example, however, the objective holder 16 and the printed circuit board substrate 40 do not contact, as in the top in FIG. 2, but they are separated from one another and kept at a distance by way of pressure-resistant spacers 46, with the distance in this case approximately corresponding to the thickness of the circuit layer. In this way, it is possible to prevent the circuit layer from being squashed when the printed circuit board is connected to the objective holder 16. However, the spacers 48 may naturally also be selected in such a way that they keep the printed circuit board 20 and the objective holder 16 at a much greater distance from one another such that, for example, the image sensor 22 remains better accessible.

FIG. 5a shows a circuit layer 42 which is connected to a printed circuit board substrate 40 by means of a floating mount 41. Mounted in a floating manner means that the circuit layer 42 is securely connected to the printed circuit board substrate 40 by means of up to three hard adhesive spots 34—only a centrally arranged hard adhesive spot 34 is depicted here (which is the preferred variant). FIG. 5a likewise depicts optional possible further connections between the circuit layer 42 and the printed circuit board substrate 40 by means of soft adhesive spots 36. Depending on the size of the circuit layer 42 and depending on the material of the circuit layer 42 and of the printed circuit board substrate 40, more than one hard adhesive spot 34 and no, only some or many soft adhesive spots 36 are required. This way of fastening a circuit layer 42 onto a printed circuit board substrate 40 reduces errors which may be induced by thermal tensions and this way of fastening is possible for all printed circuit boards that are described in these documents. More or less whole-area adhesive bonding between printed circuit board 40 and circuit layer 42 is likewise possible for all printed circuit boards described herein.

Figure 5B:
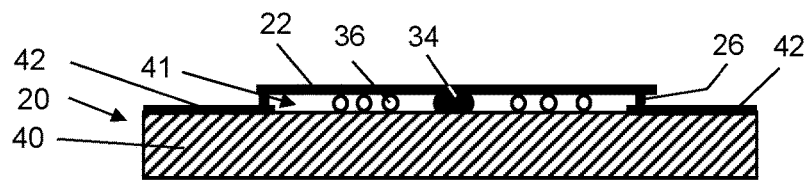

The floating mount 41 with hard and soft adhesive spots 34/36, as depicted and explained in FIG. 5a for a circuit layer 42, is also usable with analogous advantages for the connection between an image sensor 22 and a printed circuit board substrate 40 (see FIG. 5b).

Figure 6A:
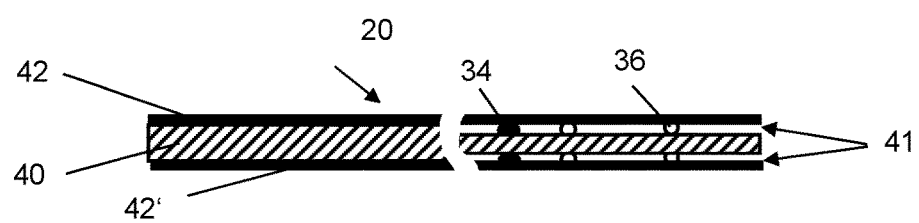
FIGS. 6a, 6b show, in sections, examples of a printed circuit board substrate with circuit layers on both sides.
Figure 6B:
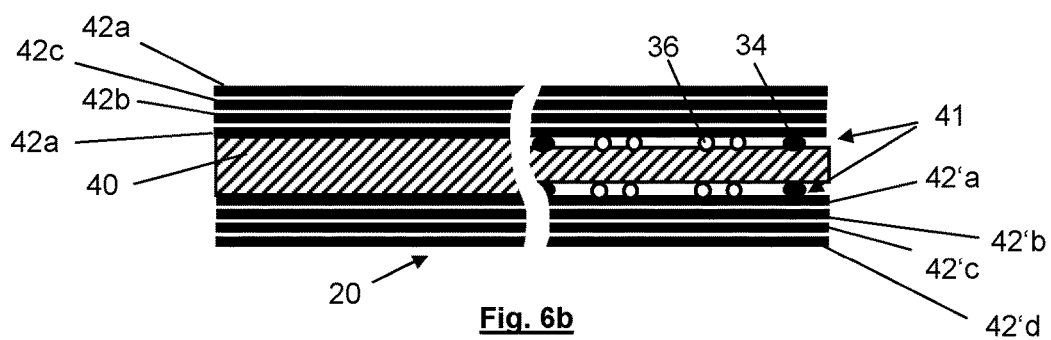
Figure 9:
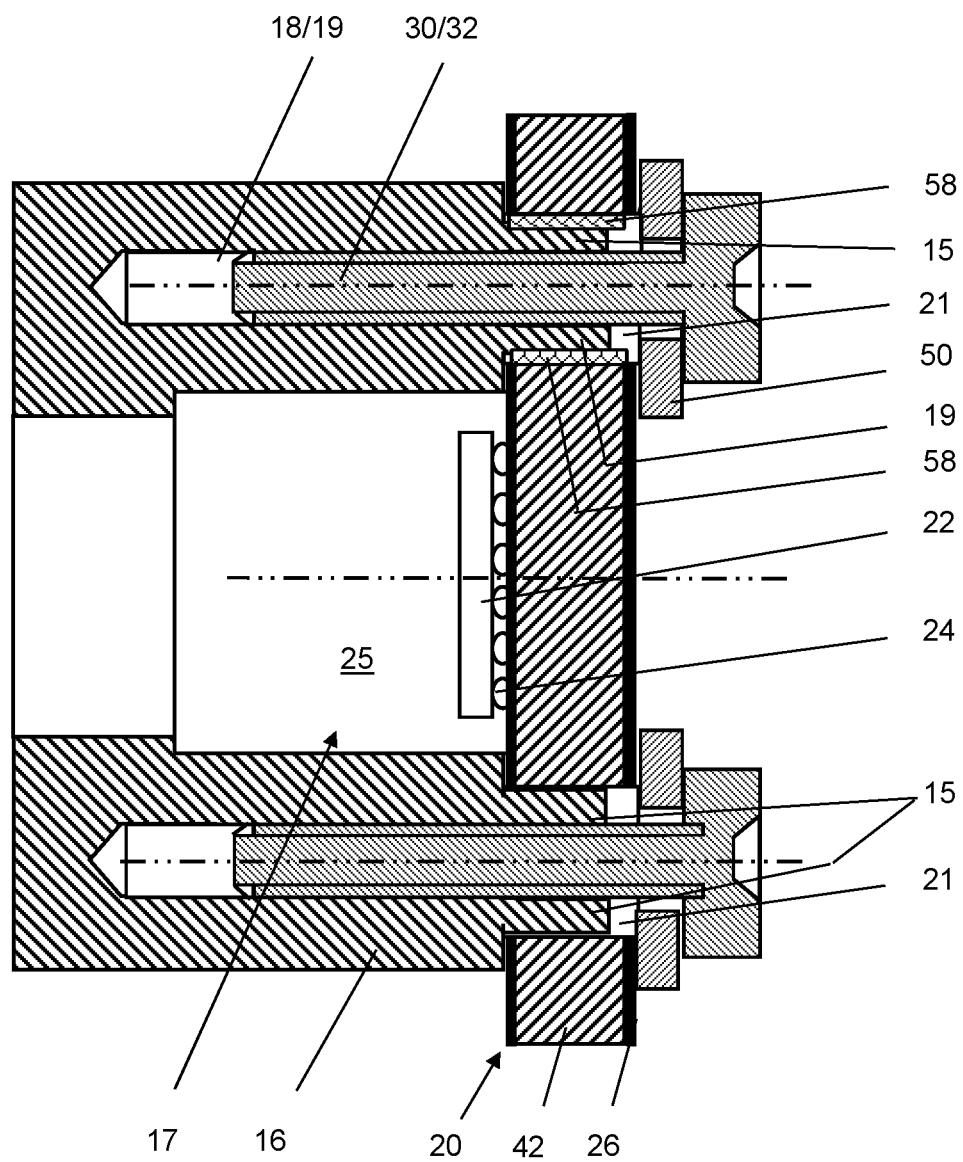
FIG. 9 shows an even further measure according to the invention on the basis of a section of a camera system as depicted in FIG. 5.

FIG. 6a depicts a printed circuit board 20 with a printed circuit board substrate 40 which is provided with a circuit layer 42, 42' on both sides in a symmetric manner. However, as depicted in FIG. 6b, two or more circuit layers 24a, 24b, 24c, 24d . . . ; 24'a, 24'b, 24'c, 24'd, . . . may also be provided on each side, with the number of circuit layers advantageously being the same on both sides. In this way, it is possible to avoid thermal tensions which could lead to mechanical bending of the printed circuit board 20 as known from bimetals, for example. It is for this reason that the printed circuit boards 20, as shown here in FIGS. 6a and 6b, are also preferably used for the camera systems 10 discussed here. Examples for this are also depicted in FIGS. 7 and 9. As a rule, the circuit layers are adhesively bonded and/or pressed to one another over more or less the entire area. However, a floating mount 41 on the printed circuit board substrate 40 of the circuit layer 42/42' or 42a, 42'a that is immediately adjacent to the printed circuit board substrate 40, as respectively depicted on the right-hand side of FIGS. 6a/6b, is likewise possible here.

As just explained, the printed circuit board substrate 40 has a circuit layer 42 on its side facing the image sensor 22 and a further circuit layer 42' on its side facing away from the image sensor 22 in the embodiment depicted in FIG. 7. This may be expedient, just like multi-layer printed circuit boards (not depicted here, see the description above), depending on the requirements that should be satisfied by the printed circuit board 20. The electrically conductive connection of the image sensor 22 with the circuit layer 42 facing it is implemented like for the examples from FIGS. 2 and 3 (see FIG. 7, left-hand side), but it may also, once again, be linked here with an attachment of the image sensor 22 on the printed circuit board substrate 40 of the printed circuit board 20 through a hole 28 of the circuit layer 42 by means of support elements 43/44 (see FIG. 7, right-hand side). The connection between objective holder 16 and printed circuit board 20 is once again realized by screws 32, wherein, either, the circuit layers 42, 42' are once again squashed, see the illustration on the left-hand side of FIG. 7, or else squashing is avoided by spacers 46 in a recess 48 on the side of the image sensor 22 and, on the opposite side, by virtue of a recess 48' being provided around the attachment opening, into which, for example, a washer/screw shearing 50, 50' with a matched thickness fits and thus is simultaneously also able to act as a spacer, as is depicted on the right-hand side of FIG. 7.

In a magnification, FIG. 9 depicts a section of a further variant of the camera system 10. Here, the printed circuit board 20 is depicted as a printed circuit board 20 with a printed circuit board substrate 40 and two mutually opposing circuit layers 42, 42', wherein the image sensor is connected, by means of a ball grid array, in an electrically conductive manner to the circuit layer 42 of the printed circuit board 20 facing it. However, it is understood that all variants of the printed circuit board and of the attachment or electrical connection 24 between the printed circuit board 20 and the image sensor 22 listed above may be realized, including those with the support element 43, 44. Likewise, it is possible to realize all of the above-described variants of the connection between printed circuit board 20 and objective holder 16.

What is specific to the connection between the printed circuit board 20 and the objective holder 16, shown here, is that the objective holder 16 has positioning flanges 15 in the region of the attachment recesses 19, 19' for receiving connecting elements 30, 30', said positioning flanges projecting from the actual objective holder in the direction of the printed circuit board 20 to be assembled and preferably surrounding the recesses 19, 19' or lengthening the latter flush in the direction of the printed circuit board to be assembled. The attachment openings 21 in the printed circuit board are configured in such a way that they receive these positioning flanges 15 with very little tolerance, e.g. H7/h6, or, even better, receive these in the form of a press fit, as illustrated on the left-hand side in FIG. 9. Geometries with a defined deformation zone are also conceivable here, and so, for example, cylinders are pressed into a rectangular hole, as a result of which the required application of force is lower for this partial pressing than for a normal press fit. For laser collimators in particular, holes with star-shaped knurling are also conceivable for a better tolerance balance. In this way, the connection between the printed circuit board 20 and, in particular, the printed circuit board substrate 40 and the objective holder 16 is improved further.

A further option (in which the manufacturing tolerances of the attachment openings 21 and of the positioning flanges 15 may be slightly higher) is depicted on the right-hand side of FIG. 9. Here, the outer sides of the positioning flanges 15 and/or the inner side of the attachment openings 21 are provided with a slow curing adhesive 58. If the connection is installed by means of the connecting elements 30, 30' and if the adhesive 58 has cured, the printed circuit board 20 and the objective holder 16 are adhesively bonded to one another and displacements of the printed circuit board 20 relative to the objective holder 16 are virtually precluded.

A very expedient connection in respect of the thermal stability was found to be had with an objective holder made of aluminum or an aluminum alloy and a printed circuit board substrate likewise made of aluminum or an aluminum alloy which is as similar as possible, these being connected by means of an adhesive with a coefficient of thermal expansion that is as similar as possible to that of aluminum or the aluminum alloy(s).

Still another measure for avoiding measurement errors can be realized in measuring appliances in which the distance variance which has to be capturable by the camera system 10 is small. The objective 14 is adhesively bonded into the objective holder 16, to be precise at a position which, at the required imaging distance, produces a sharp image on the image sensor 22, as shown in FIG. 8 using a section of a further variant of the camera system 10. To this end, e.g. a slow curing adhesive 60 is applied to the female thread of the reception opening 17 of the objective holder 16 and/or to the male thread 14 of the objective 12. The objective 14 is screwed into the objective holder 16 at a position which produces a sharp image on the image sensor 22 at the required imaging distance and it is left to rest there until the adhesive 60 has cured. Naturally, the objective can also be adhesively bonded in a similar manner if it is inserted into a sliding fit of the objective holder instead of being screwed into the objective holder, as known to a person skilled in the art, and brought into a focusing position.

Advantageously, for all of the aforementioned adhesive bonds, use is made of an adhesive 58/60 in each case which is either able to absorb tensions on account of differences in thermal expansion between the materials adjoining one another such that said adhesive is able to compensate different expansions of these materials.

Naturally, it is even better to use material pairs with the same or very similar coefficients of thermal expansion and adhesively bond these to one another by means of an adhesive which has a similar expansion coefficient to these materials. Thus, for example, it would be very advantageous to manufacture the tube of the objective and the objective holder from the same material, such as e.g. from aluminum or the same Al alloy, and to adhesively bond these to one another using a two-component epoxy adhesive, as described above.

Figure 10:
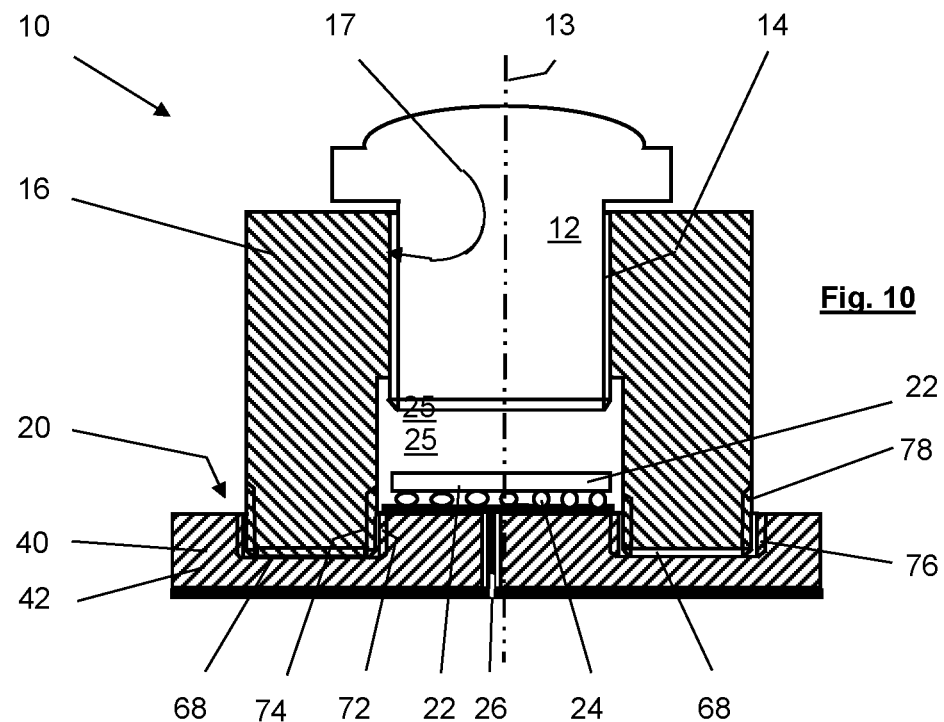
FIGS. 10 to 12 show, in sections, a further embodiment of a camera system in three different variants.

FIG. 10 shows an embodiment in which the objective holder 16 has a cylindrical embodiment on the outer and inner side thereof at the end lying opposite to the objective 12 and accordingly has a male thread 78 and a female thread 74 in the region of this cylinder. The printed circuit board substrate 40 of the printed circuit board 20 has a slightly thicker embodiment and is equipped with a corresponding groove-shaped recess 68 with the female and male thread 72, having a mirror-inverted embodiment such that the objective holder 16 can be screwed into the printed circuit board 20 or the printed circuit board 20 can be screwed onto the objective holder 16. It is also understood that only a female thread 76 or only a male thread 72 may be provided in the groove 68, with a corresponding thread 74, 78 at the objective holder 16. The image sensor 22 is connected centrally in respect of this screw-in connection to a circuit layer 42 of the printed circuit board 20 in a manner known per se. In this example, the printed circuit board 42 with the image sensor 22 is connected to the circuit layer 42' on the opposite side of the printed circuit board substrate 40 by means of an electrical connection 26 that is guided through the printed circuit board substrate 40. The electrically conductive connection 26 is realized via a continuous opening in the printed circuit board substrate 40, through which an insulated cable is guided or which is coated by insulating lacquer for the purposes of a defined electrical contact on its walls and then filled with an electrically conductive material, such as e.g. with an electrically conductive plastic, an electrically conductive adhesive, an electrically conductive lacquer, an electrically conductive solder.

Figure 11:
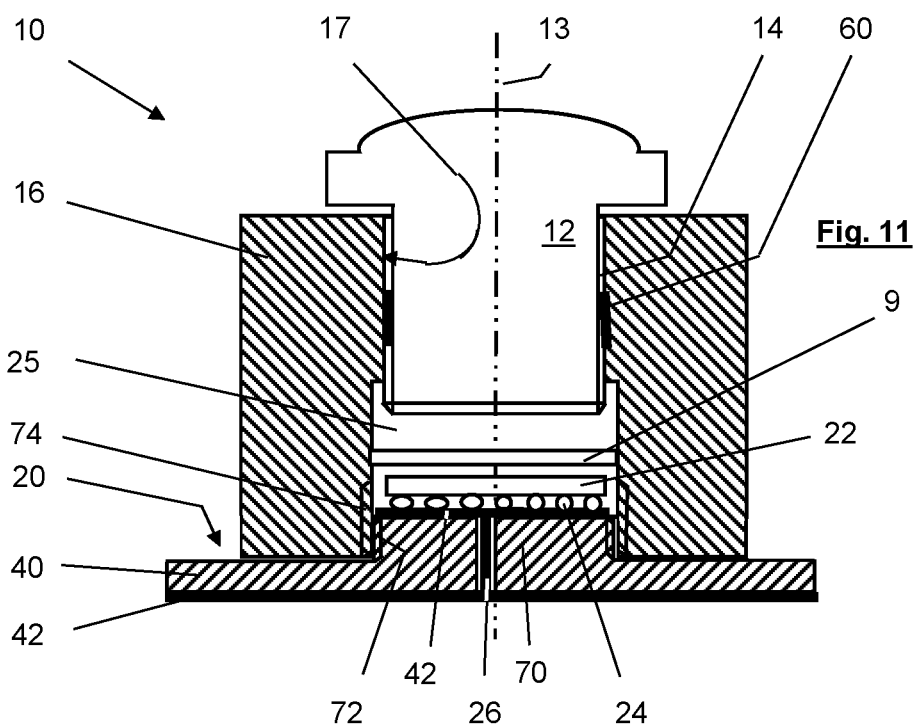

FIG. 11 depicts a variant of the camera system 10 from FIG. 10, with the printed circuit board 20 in this case having a type of cylindrical stamp with the male thread 72 centrally, said cylindrical stamp carrying the image sensor 22 and having screwed thereon the objective holder 16 with a female thread 74. Furthermore, a filter 9 is provided in an exemplary manner in the cavity 25 of the objective holder 16 in this embodiment, said filter being disposed upstream of the image sensor 22 in the optical path of the camera system. By way of example, this filter 9 may be an IR filter, a gray filter or any other spectral filter, etc.

Figure 12:
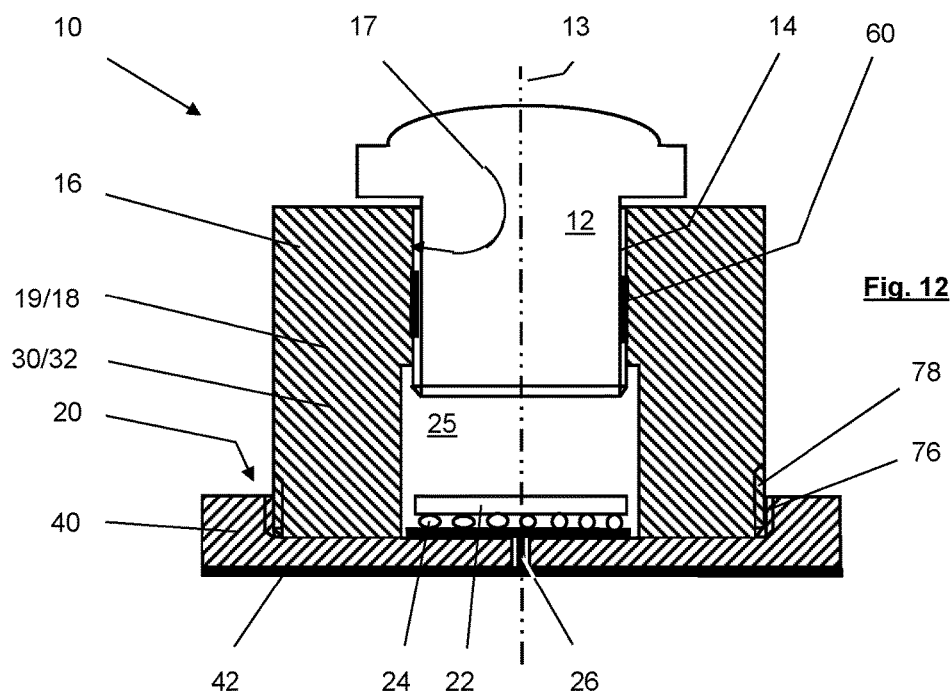

A further variant of the camera system 10 from FIG. 10 is depicted in FIG. 12, wherein, in this variant of the printed circuit board substrates 40, a type of cylindrical depression with a female thread 76, situated centrally, serves to receive an objective holder 16 with a corresponding male thread 78.

Figures 13A, 13B:
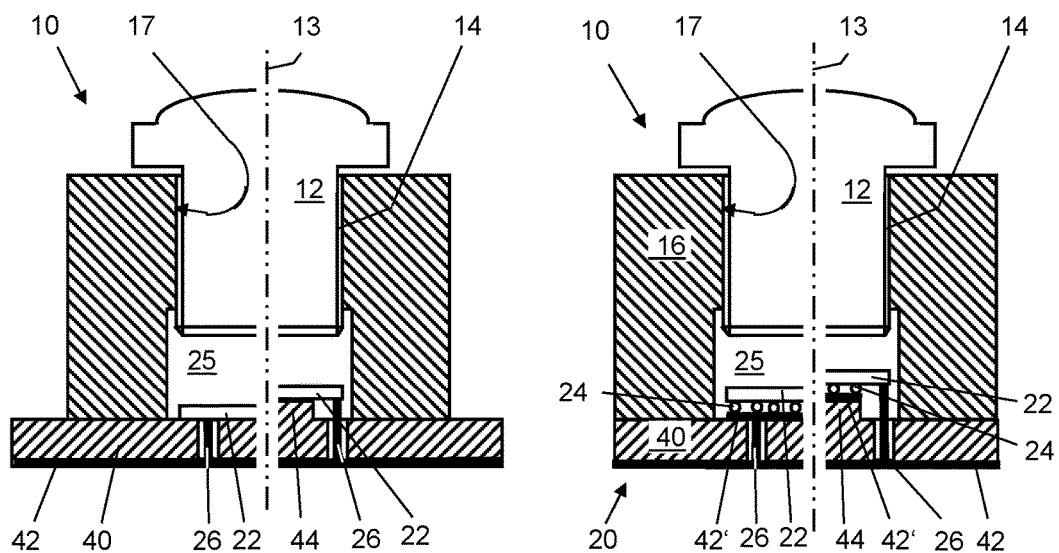
FIGS. 13a, 13b show, in sections, two variants of a further embodiment of a camera system.

In the embodiments of the camera system 10 shown in FIGS. 13a and 13b, the objective holder 16 and the printed circuit board 20 are welded to one another or soldered to one another. In the variant shown in FIG. 13a, the printed circuit board substrate 40, in this embodiment, only has a circuit layer 42 on its side facing away from the objective 12. The image sensor 22 that is arranged in the recess 25 is directly affixed on the printed circuit board substrate 40 and connected to this circuit layer 42 by way of an electrical connection 26, as was already described for FIG. 10. The variant in FIG. 13b has virtually the same embodiment, the only differences being that the objective holder 16 and the printed circuit board substrate 40 are adhesively bonded to one another in this variant and the printed circuit board substrate 40 has a circuit layer 42' in the region under the image sensor 22 as well. The attachment of the image sensor 22 to the printed circuit board 20 or the printed circuit board substrate 40 can be realized as an electrically conductive adhesive bond, also in the form of an above-described "floating mount". However, depending on the requirements, it is likewise conceivable to establish the connection between the image sensor 22 and the printed circuit board 20 by means of a ball grid array. On its side facing the objective 12, the printed circuit board substrate may have a flat embodiment, as is respectively depicted on the left-hand side in FIGS. 13a, 13b, or it may have an elevation centrally for receiving the image sensor 22, as is respectively depicted on the right-hand side in FIGS. 13a, 13b.

Figure 14:
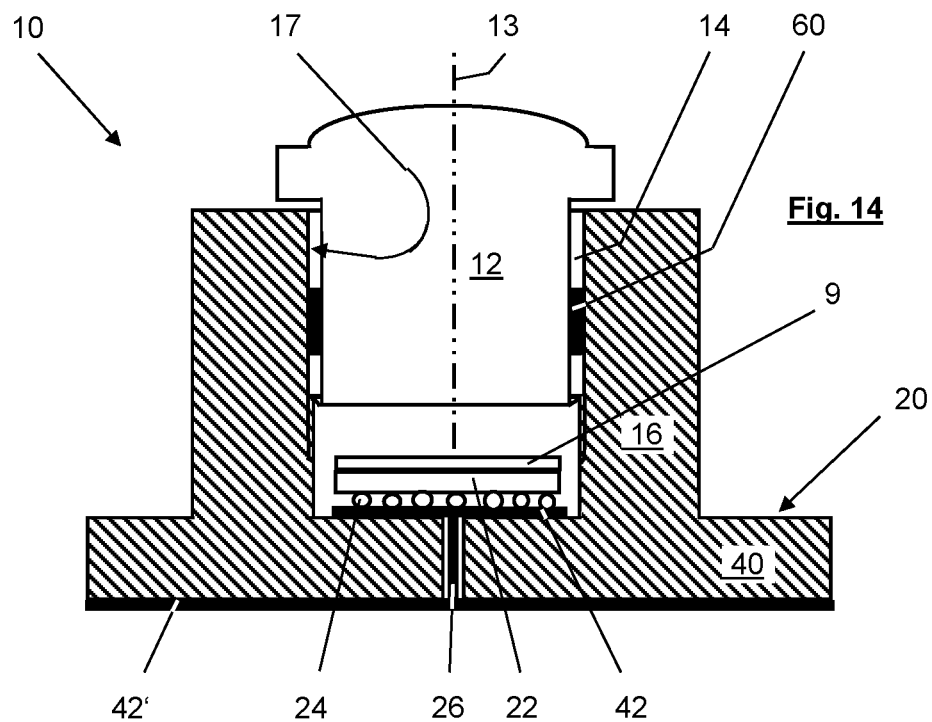
FIGS. 14 to 15 show, in sections, a further embodiment of a camera system in two different variants.
Figure 15:
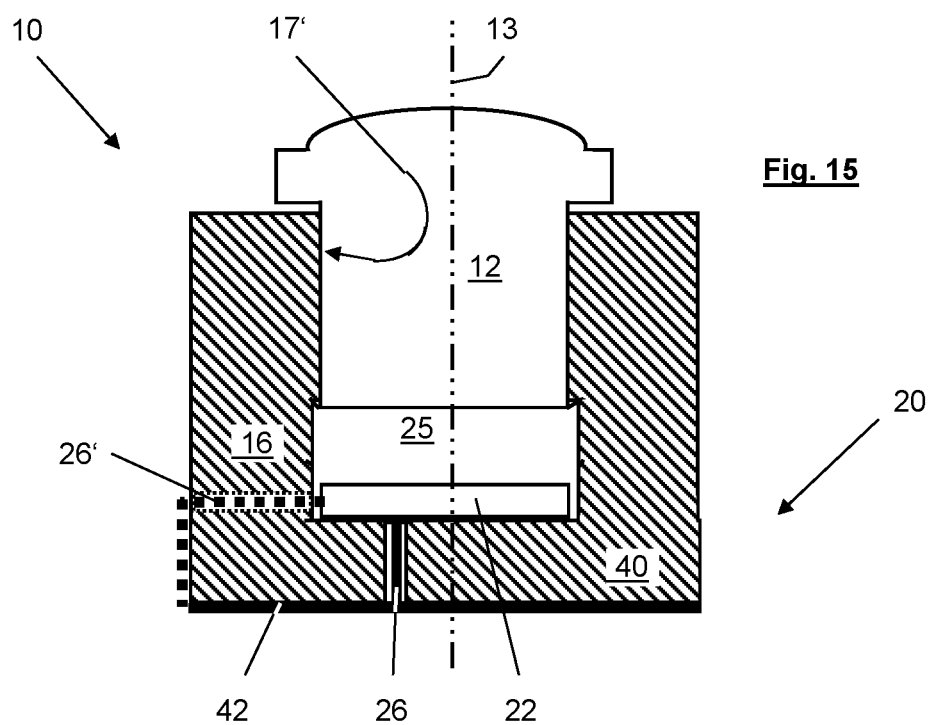

In an even further embodiment, as depicted in FIGS. 14 and 15, the objective holder 16 and the printed circuit board substrate 40 have an integral embodiment, with the printed circuit board substrate 40 in FIG. 14 having a circuit layer 42 at least on its surface that faces the objective 12 and delimits the recess 25, said circuit layer 42 being electrically conductively connected to the image sensor 22 that is affixed in the recess 25. As a result of an electrically conductive connection 26, which is guided through the printed circuit board substrate 40, this circuit layer 42 arranged under the image sensor 22 has an electrically conductive connection to a further circuit layer 42' that is attached on the opposite side of the printed circuit board substrate 40. A filter 9 is directly applied to the image sensor 22 in an exemplary manner in this embodiment, for example by adhesive bonding. By way of example, this filter 9 can be an IR filter, a gray filter or any other spectral filter etc.

The variant in FIG. 15 has a virtually identical embodiment to that of FIG. 14, the only difference being that—unlike in FIG. 14—no circuit layer is arranged under the image sensor 22. Instead, provision is made, in a manner analogous to the variants of FIG. 13a, of an electrical connection 26 to a circuit layer 42 on the side of the printed circuit board substrate 40 that lies opposite the image sensor 22. As indicated by reference sign 26, this electrically conductive connection can be guided through the printed circuit board 20 or at least the printed circuit board substrate 40 or, as indicated by the dashed line 26', it can be guided laterally through the objective holder 16. As indicated in the embodiment of FIG. 15, it is also possible to realize such a camera system 10 by virtue of the objective 12 not being connected to the objective holder 16 by means of a thread and then possibly still be adhesively bonded thereto, but rather by virtue of the objective 12 being inserted into a sliding fit 17' of the objective holder 16. This is particularly true if the objective 12 is designed as a tube that contains lenses and/or further optical elements—such as e.g. filters as well. Then, the objective 12 may, for example, be secured in the objective holder by a clamping mechanism or a bayonet closure, etc., and, depending on the demands on the camera system, it may optionally also be additionally adhesively bonded.

As clearly emerges from the various illustrations, the individual measures for minimizing errors of the camera system that are described on the basis of the figures may be combined with one another in very different ways. It is clear to a person skilled in the art that, and how, the described embodiments or the details described on the basis of the exemplary embodiments can be expediently combined with one another within the scope of protection that is defined by the claims. However, for reasons of space, it is not possible to illustrate by way of figures and/or describe all possible and meaningful combinations in detail.

What is claimed is:

1. A camera system for measurement applications, the camera system comprising:
   an objective with at least one objective lens;
   an objective holder that carries the objective;
   an image sensor; and
   a printed circuit board,
   wherein the printed circuit board and the image sensor are connected to one another in an electronically conductive manner,
   wherein the image sensor and the objective are arranged such that an image that is projected onto the image sensor by way of the objective in focus, and
   wherein:
   the objective holder is made of a material having a coefficients of thermal expansion $a_O$; and
   the printed circuit board or a printed circuit board substrate of the printed circuit board are manufactured from a material with a coefficient of thermal expansion $a_L$, wherein the coefficient of thermal expansion $a_O$ of the material the object holder is made of and the coefficient of thermal expansion $a_L$ of the material the printed circuit board or a printed circuit board substrate is made of differ from each other by no more than 30%.

2. The camera system according to claim 1, wherein the printed circuit board is manufactured as an FR4 board with a coefficient of thermal expansion in the xy-plane in the region of $a_L=12*10^{-6}/K$ to $14*10^{-6}/K$ and the objective holder is produced from a stainless steel, the coefficient of thermal expansion of which likewise lies in the region of $a_O=10*10^{-6}/K$ to $16*10^{-6}/K$.

3. The camera system according to claim 1, wherein at least one circuit layer is arranged on the printed circuit board substrate,
   wherein the circuit layer is produced from electrically insulating material and provided with predetermined circuits of the printed circuit board.

4. A camera system according to claim 3, wherein the printed circuit board substrate and the objective holder are manufactured from the same material.

5. The camera system according to claim 1, wherein the objective is manufactured from a material with a coefficient of thermal expansion $a_{objective\ material}$,
   the at least one objective lens is made of a material having a coefficient of thermal expansion $a_{objective\ material}$,
   wherein the coefficient of thermal expansion $a_{objective\ material}$ and the coefficient of thermal expansion $a_L$ differ from each other by no more than 30%.

6. The camera system according to claim 1, wherein the printed circuit board substrate is manufactured from a material having a coefficient of thermal expansion $a_L$,
   the image sensor is made of a material having a coefficient of thermal expansion $a_{image\ sensor\ material}$, wherein coefficient of thermal expansion $a_L$ and the coefficient of thermal expansion $a_{image\ sensor\ material}$ differ from each other by no more than 30%.

7. The camera system according to claim 1, wherein the objective is adhesively bonded into a reception opening of the objective holder.

8. The camera system according to claim 1, wherein adhesive connections in the camera system are embodied as thermally stable adhesive bonds, wherein the coefficient of thermal expansion $a_K$ of the employed adhesive in the adhesive connections and the thermal coefficients of the materials the components to be connected are made of, differ from each other by no more than 30%.

9. The camera system according to claim 8, wherein the employed adhesive has a coefficient of thermal expansion in the region of $a_k=22*10^{-6}/K$ to $25*10^{-6}/K$.

10. The camera system according to claim 1, wherein the printed circuit board substrate has at least one circuit layer on its side that faces the image sensor and has at least one additional circuit layer on its side that faces away from the image sensor.

11. The camera system according to claim 1, wherein the objective holder has attachment recesses for receiving connecting elements and is provided with positioning flanges in the region of the attachment recesses, said positioning flanges projecting in a direction in which the printed circuit board is assembled, and wherein the attachment openings in the printed circuit board are configured in such a way that they receive the positioning flanges.

12. The camera system according to claim 11, wherein in an assembled state:
   the positioning flanges of the objective holder are received in the attachment openings of the printed circuit board with a press fit, or
   the positioning flanges of the objective holder are adhesively bonded into the attachment openings of the printed circuit board.

13. The camera system according to claim 1, wherein the objective holder and the printed circuit board substrate each have threads so as to engage with each other, or the objective holder and the printed circuit board substrate are welded, soldered or adhesively bonded to one another.

14. The camera system according to claim 1, wherein the objective holder and the printed circuit board substrate have an integral embodiment.

15. The camera system according to claim 3, wherein the image sensor is mounted on the printed circuit board substrate in a floating fashion, such that it is securely connected to the printed circuit board substrate by means of at most three hard adhesive spots.

16. The camera system according to claim 5, wherein the coefficient of thermal expansion $a_{objective\ material}$ of the objective and the coefficient of thermal expansion $a_O$ of the objective holder differ from each other by no more than 30%.

* * * * *